United States Patent
Huang et al.

(10) Patent No.: US 7,067,418 B2
(45) Date of Patent: Jun. 27, 2006

(54) INTERCONNECT STRUCTURE AND METHOD FOR FABRICATING THE SAME

(75) Inventors: Tse-Yao Huang, Taipei (TW); Yi-Nan Chen, Taipei (TW); Chih-Ching Lin, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/908,824

(22) Filed: May 27, 2005

(65) Prior Publication Data
US 2005/0202671 A1    Sep. 15, 2005

Related U.S. Application Data

(62) Division of application No. 10/708,848, filed on Mar. 29, 2004, now Pat. No. 6,992,393.

(30) Foreign Application Priority Data
Aug. 29, 2003   (TW) .............................. 92123869 A

(51) Int. Cl.
*H01L 21/4763* (2006.01)

(52) U.S. Cl. ...................... 438/637; 438/643

(58) Field of Classification Search ............... 438/637, 438/643, 618, 622; 257/760, 773, 774
See application file for complete search history.

(56) References Cited

U.S. PATENT DOCUMENTS

| | | | |
|---|---|---|---|
| 6,376,394 B1 * | 4/2002 | Tsai et al. ................... | 438/783 |
| 6,661,097 B1 * | 12/2003 | Clevenger et al. .......... | 257/763 |
| 6,774,489 B1 * | 8/2004 | Russell et al. .............. | 257/752 |
| 6,806,579 B1 * | 10/2004 | Cowley et al. ............. | 257/762 |
| 6,960,522 B1 * | 11/2005 | Chen et al. ................. | 438/638 |
| 6,972,254 B1 * | 12/2005 | Lopatin et al. ............. | 438/637 |
| 6,992,393 B1 * | 1/2006 | Huang et al. ............... | 257/760 |
| 2004/0058526 A1 * | 3/2004 | Cowley et al. ............. | 438/637 |
| 2004/0152295 A1 * | 8/2004 | Cooney et al. ............. | 438/623 |
| 2004/0262764 A1 * | 12/2004 | Gambino et al. ........... | 257/758 |

* cited by examiner

*Primary Examiner*—Alexander Ghyka
(74) *Attorney, Agent, or Firm*—Jianq Chyun IP Office

(57) ABSTRACT

A method for fabricating interconnects is provided. The method comprises forming a conducting line on a first dielectric layer; forming a first liner layer on the surfaces of the first dielectric layer and the conducting line; forming a second liner layer on the first liner layer; forming a second dielectric layer on the second liner layer, wherein the etching selectivity rate of the second dielectric layer is higher than the etching selectivity rate of the second liner; and patterning the second dielectric layer to form a contact window opening through the second liner layer and the first liner layer to expose the surface of the conducting line. Because the second dielectric layer having an etching rate higher than the etching rate of the second liner layer, the second liner layer can be used as an etch stop layer while patterning the second dielectric layer.

10 Claims, 2 Drawing Sheets

INTERCONNECT STRUCTURE AND METHOD FOR FABRICATING THE SAME

CROSS-REFERENCE TO RELATED APPLICATION

This application is a divisional of a prior application Ser. No. 10/708,848, filed Mar. 29, 2004, now U.S. Pat. No. 6,992,393 which claims the priority benefit of Taiwan application serial no. 92123869, filed on Aug. 29, 2003.

BACKGROUND OF THE INVENTION

1. Field of the Invention

This invention generally relates to a semiconductor device and a method for fabricating the same, and more particularly to an interconnect structure and a method for fabricating the same.

2. Description of Related Art

For current VLSI fabrication processes, most semiconductor devices use two or more interconnects for routing in order to achieve a higher integration level.

For a conventional process for multi-level interconnects, a silicon oxide inter level dielectric (ILD) is formed on the substrate to cover the device on the substrate. Then a contact window is formed in the ILD electrically connected to the selected device. A conducting line is formed on the ILD to electrically connect to the contact window. The conducting line is formed by stacking a Ti/TiN barrier layer, an Al layer, and a Ti/TiN barrier layer. The above process is for a single-level interconnect. The multi-level interconnects can be fabricated by repeating the above steps.

However, problem occurs while a contact window is formed in the second-level ILD on the first-level interconnect. Conventionally, the contact window is formed by forming an opening in ILD to expose the conducting line and then filling a conducting material into the opening. However, when etching the ILD to form the opening, over-etching may happen due to inappropriate etching control. If the etching process does not stop on the Ti/TiN barrier layer above the Al layer, the Al layer will be etched so that the resistance will increase. For a process with a line width of 0.12 μm or below, this etching process is more difficult to control. Hence, the issue of over-etching becomes more critical for a process with a line width of 0.12 μm or below.

SUMMARY OF THE INVENTION

An object of the present invention is to provide an interconnect structure and a method for fabricating the same to prevent the Al layer form over-etching due to the difficulty to control the end point of the etching process.

The present invention provides a method for fabricating interconnects, comprising: forming a conducting line on a first dielectric layer; forming a first liner on the surfaces of the first dielectric layer and the conducting line; forming a second liner on the first liner, the dielectric layer having an etching rate; forming a second dielectric layer on the second liner, the dielectric layer having an etching rate higher than the etching rate of the dielectric layer; and patterning the second dielectric layer to form a contact window opening through the second liner and the first liner to expose the surface of the conducting line.

The present invention provides an interconnect structure, comprising: a first dielectric layer; a conducting line on the first dielectric layer; a first liner on the surfaces of the first dielectric layer and the conducting line; a second liner on the surface of the first liner; and a second dielectric layer covering the second liner, the second dielectric layer having a contact widow opening through the second liner and the first liner to expose the surface of the conducting line.

In brief, because the etching rate of the second liner on the conducting line is lower than that of the second dielectric layer, the second liner can be a stop layer while patterning the second dielectric layer. Hence, an over-etching of the Al layer and a subsequent increased of the resistance are precluded.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

FIGS. 1A–1E show the cross-sectional view of for fabricating an interconnect structure in accordance with a preferred embodiment of the present invention.

Figure 1A:
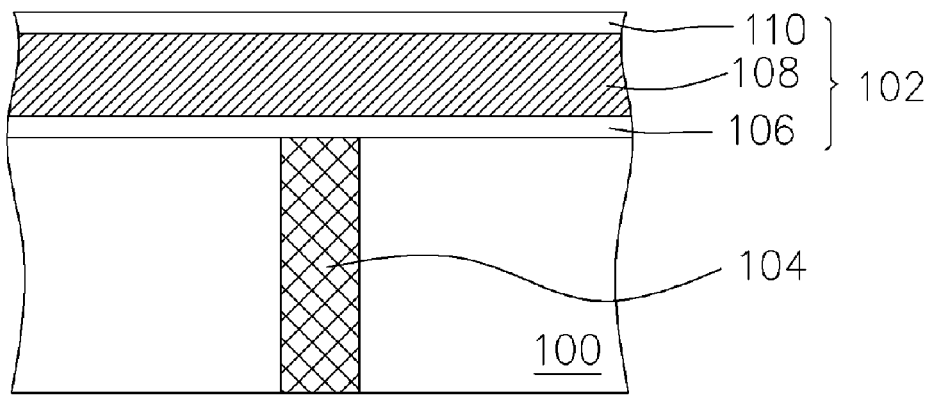
FIGS. 1A–1E show the cross-sectional view of a preferred embodiment for fabricating an interconnect structure in accordance with the present invention.

Referring to FIG. 1A, a dielectric layer 100 having a contact window 104 is provided. The dielectric layer 100 is, for example, silicon oxide. Further, the dielectric layer 100 can be used as an ILD. The dielectric layer 100 is formed above the substrate (not shown) to cover the device structures (not shown) on the substrate. The thickness of the dielectric layer 100 is between 6000 and 7200 Å. The contact window 104 is electrically connected to the underlying selected device. The diameter of the contact window is approximately 0.35 μm. The contact window can be W or polysilicon. In a preferred embodiment of the present invention, if the material of the contact window is W, an adhesive Ti/TiN layer can be formed between the contact window 104 and the dielectric layer 100 to enhance the adhesion of W to the dielectric layer 100.

Referring to FIG. 1A, a conducting line layer 102 is formed on the dielectric layer 100. The conducting line layer 102 can be formed by performing physical vapor deposition to sequentially form a barrier layer 106, a metal layer 108, and a barrier layer 110 on the dielectric layer 100. The total thickness of these three layers is between 2500–4000 Å. The material of the metal layer 108 is Al-dominated, such as, Al or Al—Cu alloy. The barrier layers 106 and 110 can be a single TiN layer or a stacked layer including a TiN layer and a Ti layer.

In a preferred embodiment of the present invention, the barrier layer 106 is a single Ti layer, and the barrier layer 108 is a stacked Ti/TiN layer. In another preferred embodiment of the present invention, the barrier layer 106 is a stacked Ti/TiN layer, and the barrier layer 110 is a single Ti layer. In another preferred embodiment of the present invention, both of the barrier layers 106 and 110 are stacked Ti/TiN layers. In other words, the conducting line layer 102 is a four-layered or five-layered structure including a metal layer 108, two barrier layers 106 and 110. Further, the Ti layer is used to prevent electromigration of the metal layer 108. The TiN layer is used to prevent the metal layer from reacting with the contact window of W so that the resistance of the metal layer and the contact window will not increase.

Figure 1B:
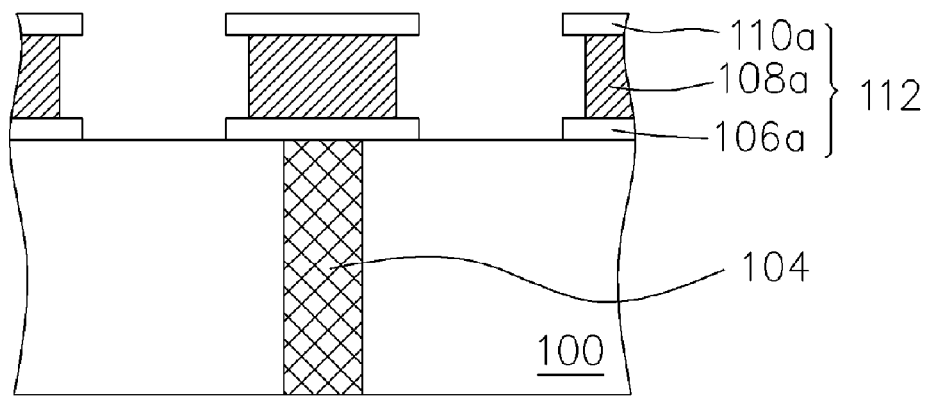

Referring to FIG. 1B, the conducting line layer 102 is patterned to form the conducting line 112. The conducting line 112 is electrically connected to the contact window 104. The conducting line 112 includes the patterned barrier layer 106, metal layer 108a, and barrier layer 110a. The patterned conducting line layer 102 is formed by forming a patterned photoresist layer (not shown) as a mask and etching the conducting line layer 102.

Figure 1C:
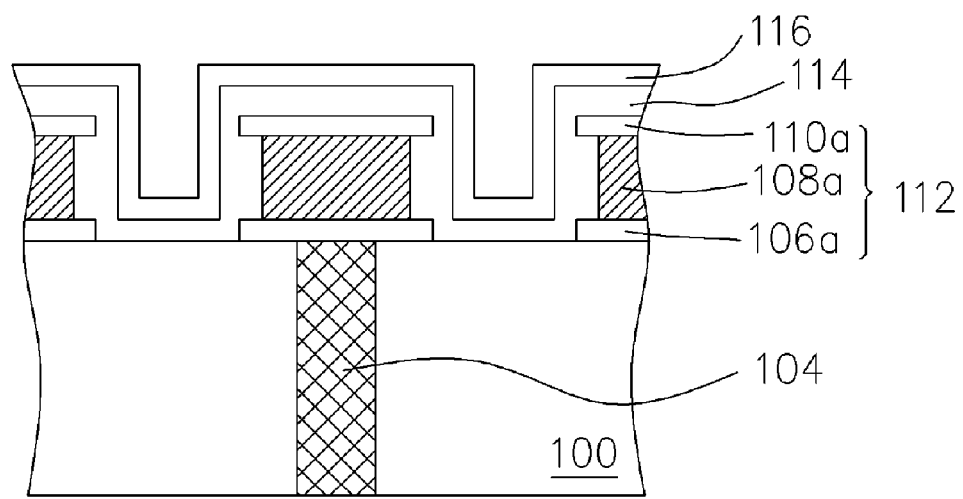

Referring to FIG. 1C, a liner layer 114 is formed on the surfaces of the dielectric layer 100 and the conducting line 112. The liner layer 114 is, for example, silicon oxide and is formed by, for example, performing a high-density plasma chemical vapor deposition (HDPCVD) process. The thickness of the liner layer 114 is between 100–200 Å.

Then, a liner layer 116 is formed on the surface of the layer 114. The liner 116 is SiNx or SiON, and is formed by, for example, performing a CVD process at a temperature of approximately 400° C. The thickness of the liner 116 is between 110–130 Å. It should be noted that the dielectric coefficient of the silicon oxide liner layer 114 is smaller than that of the SiNx or SiON liner layer 116. The generation of parasitic capacitance can be avoided in the subsequent process.

Figure 1D:
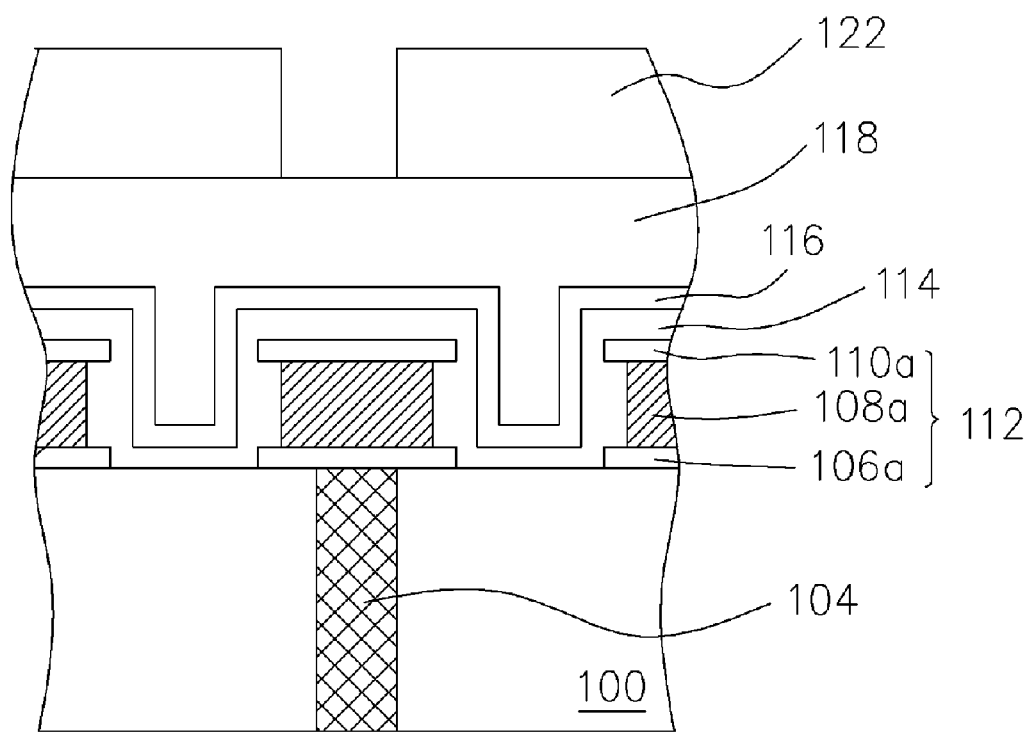

Referring to FIG. 1D, a dielectric layer 118 is formed on the liner layer 116. The material of the dielectric layer 118 is the same as that of the liner layer 116, such as, silicon oxide. The dielectric layer 118 is formed by performing a high-density plasma chemical vapor deposition (HDPCVD). Further, the height of the dielectric layer 118 is about 6000 Å above that of the liner layer 116.

It should be noted that the silicon oxide dielectric layer 118 has an etching rate higher than the etching rate of the SiNx or SiON liner layer 116. The etching selectivity ratio of the silicon oxide dielectric layer 118 to the SiNx or SiON liner layer 116 is, for example, between 50 and 70. Hence, it is more difficult to remove the liner layer 116 than the dielectric layer 118. Therefore, the liner layer 116 can be used for an etch stop layer for the subsequent process to pattern the dielectric layer 118.

Referring to FIG. 1D, a patterned photoresist layer 122 is formed on the dielectric layer 118 by performing a spin coating process to form a photoresist material layer (not shown), followed by performing a photolithography process. In another preferred embodiment of the present invention, before forming the photoresist material layer, an anti-reflective coating (ARC) is formed on the dielectric layer 118 to prevent the photoresist material layer from undesired exposure in the subsequent exposure processes. The material of the ARC can be organic or inorganic.

Figure 1E:
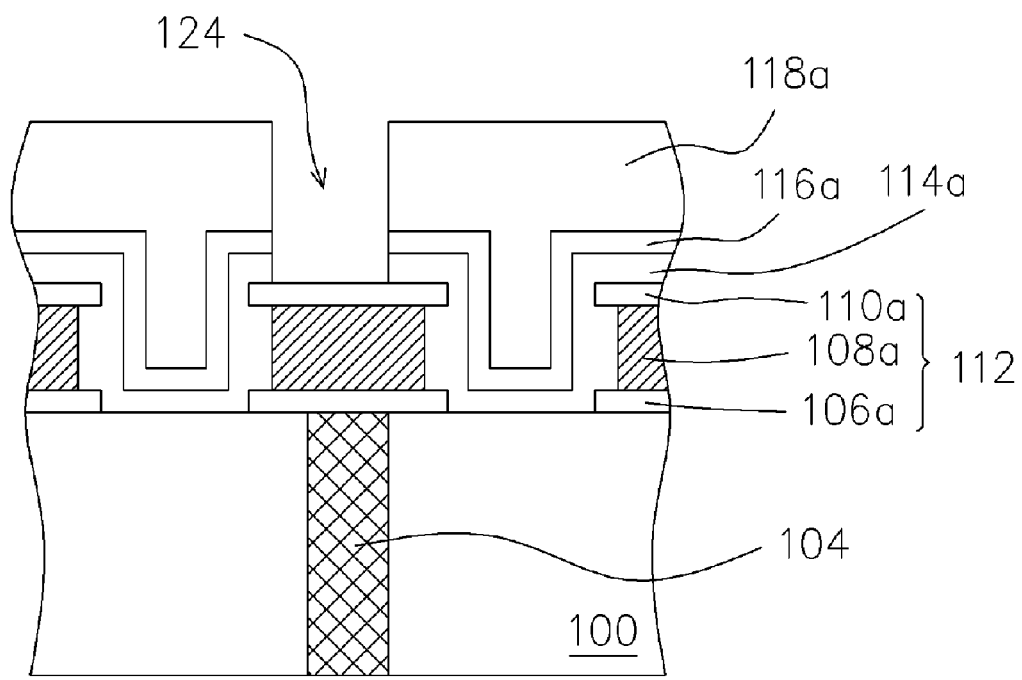

Referring to FIG. 1E, the dielectric layer 118 is patterned to form a contact window opening 124 through the liner layer 114a and the liner layer 116a to expose the surface of the conducting line 112. The dielectric layer 118 is patterned by using the photoresist layer 122 as a mask and performing a dry etching process. Then, the photoresist layer 122 is removed.

It should be noted that the silicon oxide dielectric layer 118a has an etching rate higher than the etching rate of the SiNx or SiON liner 116a. Hence, it is more difficult to remove the liner 116a than the dielectric layer 118a. Therefore, the liner 116 can be used for an etch stop layer for patterning the dielectric layer 118a. In other words, during the etching process on the liner 116a, the etching rate gradually reduces to prevent the conducting line 122 from being over-etched.

After forming the contact window opening 124, a conducting material (not shown) can be filled into the contact window opening 124 to form the contact, which is electrically connected to the conducting line 112. The conducting material can be tungsten or polysilicon.

The interconnect structure of the present invention is illustrated as follows. Referring to FIG. 1F, the interconnect structure includes a contact 104, dielectric layer 100 and 118a, a conducting line 112, and liners 114a and 116a.

The contact 104 is configured in the dielectric layer 100. The conducting line 112 is disposed on the dielectric layer 100 and is electrically connected to the contact 104. The conducting line 1122 is a stacked structure including a barrier layer 106a, a metal layer 108a, and a barrier layer 110a. For example, the conducting line 112 is a four-layered or five-layered structure, which includes a metal layer 108a, two barrier layers 106a and 110a as mentioned above.

The liner layer 114a is disposed on the surfaces of the dielectric layer 100 and the conducting line 112. The liner 114a is, for example, silicon oxide, and the thickness of the liner layer 114a is between 100–200 Å. The liner layer 116a is disposed on the surface of the liner layer 114a. The liner layer 116a is SiNx or SiON, and the thickness of the liner layer 116a is between 110–130 Å. The etching selectivity ratio of the silicon oxide dielectric layer 118a to the SiNx or SiON liner 116a is, for example, between 50 and 70.

Further, the dielectric layer 118a covers the liner layer 116a, and the dielectric layer 118a has a contact widow opening 124 formed therein, through the liner layers 114a and 116a to expose the surface of the conducting line 112.

In a preferred embodiment of the present invention, a conducting material (not shown) can be filled into the contact window opening 124 to form the contact, which is electrically connected to the conducting line 112. The conducting material can be tungsten or polysilicon.

It should be noted that the silicon oxide dielectric layer 118a has an etching rate higher than the etching rate of the SiNx or SiON liner layer 116a. Hence, it is more difficult to remove the liner layer 116a than the dielectric layer 118a. Therefore, the liner layer 116a can be used for an etch stop layer for patterning the dielectric layer 118a. In other words, during the etching process on the liner layer 116a, the etching rate becomes lower to prevent the conducting line 122 from being over-etched.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method for fabricating interconnects, comprising:
   forming a conducting line on a first dielectric layer;
   forming a first liner layer on the surfaces of said first dielectric layer and said conducting line;
   forming a second liner layer on said first liner, said dielectric layer having an etching rate;
   forming a second dielectric layer on said second liner, said second dielectric layer having an etching rate higher than said etching rate of said second liner; and
   patterning said second dielectric layer to form a contact window opening through said second liner layer and said first liner layer to expose the surface of said conducting line.

2. The method of claim 1, wherein said conducting line is formed by stacking a first barrier layer, an Al-dominated metal layer, and a second barrier layer.

3. The method of claim 2, wherein each of said first barrier and second barrier layers is a TiN layer or a stacked layer comprising a TiN layer and a Ti layer.

4. The method of claim 1, wherein said step of forming said first liner layer includes performing a high-density plasma chemical vapor deposition (HDPCVD) process.

5. The method of claim 1, wherein materials of said first liner and said second dielectric layer are same.

6. The method of claim 1, wherein an etch selectivity ratio of said second dielectric layer to said second liner is between 50 and 70.

7. The method of claim 1, wherein said second dielectric layer includes silicon oxide.

8. The method of claim 1, wherein said second liner is SiNx or SiON.

9. The method of claim 1, wherein before said step of forming said conducting line, the method further comprises forming a contact window in said first dielectric layer, and said contact window being electrically connected to said conducting line.

10. The method of claim 1, wherein before said step of forming said contact window opening, the method further comprises filling a conducting layer into said contact window opening.

* * * * *